(12) United States Patent
Adams et al.

(10) Patent No.: US 12,056,137 B2
(45) Date of Patent: Aug. 6, 2024

(54) DATA PROCESSING SYSTEM

(71) Applicant: DATAOPS SOFTWARE LIMITED, Cobham (GB)

(72) Inventors: Guy Adams, Milton Keynes (GB); Colin Bradford, Milton Keynes (GB)

(73) Assignee: DATAOPS SOFTWARE LIMITED, Cobham (GB)

( * ) Notice: Subject to any disclaimer, the term of this patent is extended or adjusted under 35 U.S.C. 154(b) by 206 days.

(21) Appl. No.: 16/778,340

(22) Filed: Jan. 31, 2020

(65) Prior Publication Data
US 2020/0250186 A1    Aug. 6, 2020

(30) Foreign Application Priority Data
Jan. 31, 2019   (GB) ..................................... 1901369

(51) Int. Cl.
*G06F 16/2458*   (2019.01)
(52) U.S. Cl.
CPC ................ *G06F 16/2465* (2019.01)
(58) Field of Classification Search
CPC .................................................. G06F 16/2465
See application file for complete search history.

(56) References Cited

U.S. PATENT DOCUMENTS

| | | | |
|---|---|---|---|
| 2007/0299865 A1* | 12/2007 | Nakano | G06F 16/2264 707/999.102 |
| 2010/0325132 A1 | 12/2010 | Liu | |
| 2014/0149444 A1 | 5/2014 | Pompey | |
| 2018/0365298 A1 | 12/2018 | Poghosyan | |
| 2018/0365301 A1 | 12/2018 | Poghosyan | |
| 2021/0096556 A1* | 4/2021 | Nakamura | G05B 23/024 |

FOREIGN PATENT DOCUMENTS

| | | |
|---|---|---|
| JP | 2005-032018 A | 2/2005 |
| JP | 2013-069189 A | 4/2013 |

OTHER PUBLICATIONS

European Extended Search Report dated Apr. 16, 2020 for EP Patent Application No. 20155002.7.
Examination Report dated Feb. 22, 2022 for EP Patent Application No. 20155002.7. 13 pages.
Examination Report dated Jun. 29, 2022 for GB Patent Application No. GB1901369.7. 6 pages.

* cited by examiner

*Primary Examiner* — Apu M Mofiz
*Assistant Examiner* — Husam Turki Samara
(74) *Attorney, Agent, or Firm* — Haynes and Boone, LLP

(57) ABSTRACT

A computer-implemented method includes: obtaining input data comprising a plurality of data values, wherein each data value is associated with a time value; obtaining a plurality of threshold criteria; and (a) selecting, or generating, a dataset or a plurality of datasets that are different to one another from the input data, and determining whether each selected, or generated dataset meets a threshold criterion of the plurality of threshold criteria; and (b) causing each selected, or generated, dataset that meets the threshold criterion to be stored in memory in association with the threshold criterion, repeating (a) and (b) for each threshold criterion of the plurality of threshold criteria, thus causing a plurality of datasets to be stored in the memory, wherein each stored dataset meets a threshold criterion of the plurality of threshold criteria.

31 Claims, 12 Drawing Sheets

FIG. 7

| Timestamp $t$ | 0 | 1 | 2 | 3 | 4 | 5 | 6 | 7 | 8 | 9 | 10 |
|---|---|---|---|---|---|---|---|---|---|---|---|
| Position offset $p$ | 0.000 | 0.309 | 0.588 | 0.809 | 0.951 | 1.000 | 0.951 | 0.809 | 0.588 | 0.309 | 0.000 |
| Speed $s$ | 1.0 | 1.3 | 1.2 | 1.5 | 1.4 | 1.7 | 1.6 | 1.9 | 1.8 | 2.1 | 2.0 |

FIG. 8

| Timestamp $t$ | 0 | 1 | 2 | 3 | 4 | 5 | 6 | 7 | 8 | 9 | 10 |
|---|---|---|---|---|---|---|---|---|---|---|---|
| $x$ | 0.000 | 0.156 | 0.309 | 0.454 | 0.588 | 0.707 | 0.809 | 0.891 | 0.951 | 0.988 | 1.000 |
| $y$ | 1.000 | 0.988 | 0.951 | 0.891 | 0.809 | 0.707 | 0.588 | 0.454 | 0.309 | 0.156 | 0.000 |

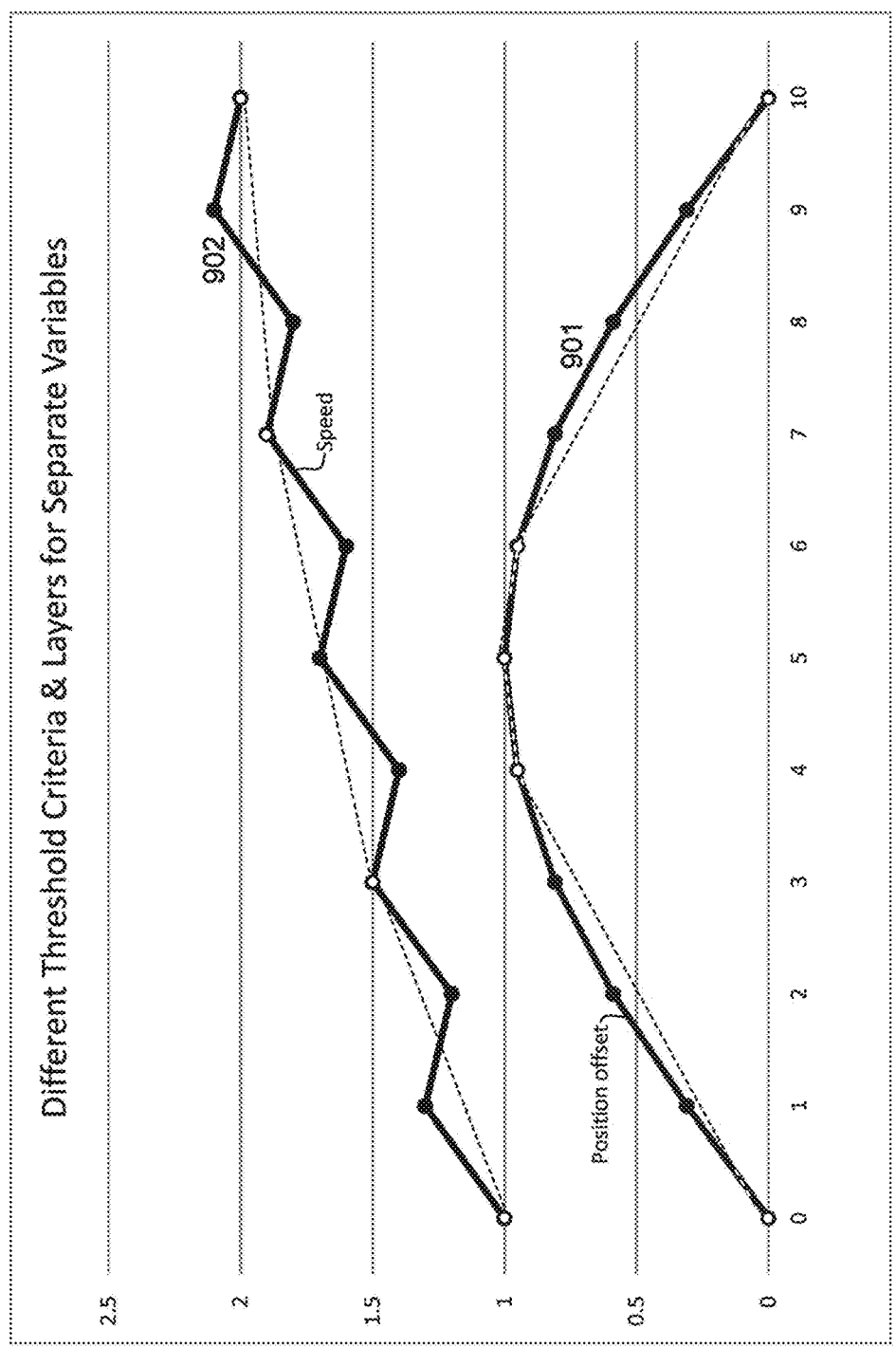

DATA PROCESSING SYSTEM

TECHNICAL FIELD

This disclosure relates to a computer-implemented method and a data-processing system for generating a plurality of datasets from input data, each one of the datasets meeting a threshold criterion of a plurality of different threshold criteria.

BACKGROUND

With increasingly easy access to 'big data' resources, and with increased use of low-powered 'internet of things' devices with limited computational abilities, the need to compress time-series data or otherwise filter out the most important features from many data points is vital. Using a smaller subset of the original data source is a possible solution; however, a trade-off must exist between the accuracy, or fidelity, of any subset and the size of that subset. Fewer data points necessarily results in reduced fidelity when compared to the original dataset. However, the requirement still exists for some guarantee of data quality, for instance by meeting a minimum accuracy value in the reduced (compressed) subsets of data.

Existing data encoding and methods for time series data compression, or downsampling, have been implemented in various systems across industries. Some of these previous methods include sampling the time series at fixed time intervals, or removing data points with values equal to those occurring immediately before and after. This approach is simple to implement, but can seriously degrade the accuracy of the data. Fixed time sampling is rarely used in real-world scenarios, since important features in the time series data may be missed if they occur with a frequency above the rate at which samples are taken.

The removal of duplicate data points may be unsuitable in situations where precision measurements are taken, since these will likely never be exact duplicates. In these cases some threshold must be set at which values can be considered to be 'the same'. This results in loss of data resolution, and the quality of the data can no longer be guaranteed.

Further examples involve interpolating between existing data points, in order to store a representation of time-series data in a compressed form while maintaining the main features of the data. In its simplest implementation, this may involve the division of the time series into fixed-size 'windows' and averaging the values within them. Again, this approach can be very 'lossy', particularly when the range of values within a window is large.

Any of the numerous methods involving interpolation of data points necessarily requires the creation (by some form of inference, usually averaging) of new data points. This has implications both in terms of accuracy of the resultant dataset, and also in terms of auditing and quality. In other words, some data has to be 'made up', and then added.

An example of time-series data being compressed is in adaptive video streaming. This involves taking a single input stream and outputting multiple streams of the same video in different bitrates, such that an end user can be provided with variable quantities of streaming data depending on available bandwidth.

Methods such as Scalable Video Coding (SVC) that do not explicitly rely on interpolation do not supply guarantees of accuracy, in terms of the accuracy with which a selected subset of data is representative of the original dataset. Moreover, video encoding in particular is necessarily dependent on 'evenly spaced' (in other words, regular) time series data where the data points are delivered with known intervals.

Typically, encoding in conventional compression algorithms is presented as a single-pass process that results in one output dataset. Thus, it is not be possible to recover the original data series from the encoded data, nor to query the encoded data for representations of the time series at varying levels of fidelity/accuracy.

When using data in different scenarios, differing resolutions of the time series may be required, and there is a need for a method of storing the data such that a user can request as small a subset of the data as possible that still meets a required level of fidelity when compared to the entire original data series.

It may also be a requirement that for some purposes or tasks that the entire original un-altered time series data must be recovered from the encoded and stored data. This may be of value in scenarios where high fidelity is required.

As such there is a need for a system that encodes (for compression) time series data with guarantees of statistical measures (for instance, accuracy), that does not require data to be evenly temporally spaced, and that does not rely on interpolating between extant data points in order to maintain these features.

SUMMARY

This disclosure relates to a computer-implemented method that involves taking as an input, a time series dataset, and a series of thresholds for some statistical measurement criterion; iteratively selecting (or creating) data points from the time series data, and checking the subset to see if it is within the threshold of the lowest desired criterion threshold until a subset of the time series data has been selected and either labelled or stored as "layer 0". The method continues to the next level of accuracy by iteratively selecting (or creating) data points from the remaining set of time series data until that subset of data, along with the previous subset of data, meets the next threshold for the chosen statistical measurement criterion; and continuing until all threshold levels have a corresponding subset of data.

In the scenario where existing data points are selected only, the subsets (layers) of data points may be cumulable: that is, the union of all subsets is equivalent to the original raw data series.

The time series data comprises data representing a time-step or time-stamp, and at least one value corresponding to each time-step or time-stamp.

In the method, the union of encoded layers are returned for a given user input criterion threshold, such that when the encoded data is queried with a threshold, the data points in the first layer to exceed that threshold (and the data points in all layers below it) are returned.

The statistical measurement criterion may be a measure of the accuracy with which the selected subset of data represents the original time series dataset. The measure of whether a layer conforms to an accuracy threshold may be a measure of the percentage difference between the subset of data in that layer and the original dataset. An additional processing or encoding stage may occur, involving the removal of data points from a layer if they are calculated to be extraneous to the layer meeting its input threshold.

In one aspect of the invention, there is provided a computer-implemented method comprising: obtaining input data comprising a plurality of data values, wherein each data value is associated with a time value; obtaining a plurality of threshold criteria; and (a) selecting, or generating, a dataset or a plurality of datasets that are different to one another from the input data, and determining whether each selected, or generated dataset meets a threshold criterion of the plurality of threshold criteria; and (b) causing each selected, or generated, dataset that meets the threshold criterion to be stored in memory in association with the threshold criterion, repeating (a) and (b) for each threshold criterion of the plurality of threshold criteria, thus causing a plurality of datasets to be stored in the memory, wherein each stored dataset meets a threshold criterion of the plurality of threshold criteria; and wherein each stored dataset comprises a plurality of data values and an indication of the time value associated with each one of the plurality of data values.

In another aspect of the invention, there is provided a data processing system comprising one or more processors configured to carry out the method of obtaining input data comprising a plurality of data values, wherein each data value is associated with a time value; obtaining a plurality of threshold criteria; and (a) selecting, or generating, a dataset or a plurality of datasets that are different to one another from the input data, and determining whether each selected, or generated dataset meets a threshold criterion of the plurality of threshold criteria; and (b) causing each selected, or generated, dataset that meets the threshold criterion to be stored in memory in association with the threshold criterion, repeating (a) and (b) for each threshold criterion of the plurality of threshold criteria, thus causing a plurality of datasets to be stored in the memory, wherein each stored dataset meets a threshold criterion of the plurality of threshold criteria; and wherein each stored dataset comprises a plurality of data values and an indication of the time value associated with each one of the plurality of data values.

In another aspect of the invention, there is provided a data processing system comprising: data processing system comprising: an input module arranged to: obtain input data comprising a plurality of data values, wherein each data value is associated with a time value; and obtain a plurality of threshold criteria; a processor module arranged to: (a) select, or generate, a dataset or a plurality of datasets that are different to one another from the input data, and determine whether each selected, or generated dataset meets a threshold criterion of the plurality of threshold criteria; (b) cause each selected, or generated, dataset that meets the threshold criterion to be stored in memory in association with the threshold criterion; and repeat (a) and (b) for each threshold criterion of the plurality of threshold criteria, thus causing a plurality of datasets to be stored in the memory, wherein each stored dataset meets a threshold criterion of the plurality of threshold criteria; and wherein each stored dataset comprises a plurality of data values and an indication of the time value associated with each one of the plurality of data values.

The present invention provides a mechanism for outputting data from input data that is stratified into 'layers' of data each meeting a different criteria. Thus, it is possible for a user to specify the required threshold criterion, and therefore the layer of data that meets the required threshold criterion can be returned, without having to transmit the entirety of the input data to the user. In this way, it is possible to reduce the usage of computing resources (such as bandwidth and storage) that are required when a user recalls information from a location, such as from a server.

Existing systems do not offer any kind of stratified method for accessing the data once encoding has taken place.

BRIEF DESCRIPTION OF THE DRAWINGS

Embodiments of the invention will be described, by way of example, with reference to the following drawings, in which:

FIG. 7 illustrates an example structure of multivariate encoded data, showing time series data points with values for both a position offset variable p and a speed variable s;

FIG. 8 illustrates another example structure of multivariate encoded data, showing time series data points with values for both a first coordinate x and a second coordinate y;

FIG. 9c illustrates an example of an encoding of multivariate data according to yet another method of determining whether the layer is sufficiently representative of the input data;

DETAILED DESCRIPTION

This disclosure presents a method of processing, or encoding, time series data into a layered structure that enables a user to request a, typically small, subset of the original data that conforms to a specified criterion. Examples of this criterion may be any statistical measure of how accurately a subset of data represents the data from which the subset was taken. For instance, this criterion may be expressed as a measure of how similar the original dataset's mean value is to the mean value of the subset, which can be expressed as a percentage. The method of determining similarity between datasets may be any one of many that would be readily understood by the skilled person. However, one specific (non-limiting) example of such a method involves: determining whether a particular dataset meets the criterion may involve: calculating a first average of data values in the dataset; calculating a second average of data values in the input data; calculating an accuracy score by determining a difference between the first average and the second average and dividing the difference by the second average; and determining whether the accuracy score meets the threshold criterion. The accuracy score may be expressed as a percentage.

The criteria may be represented a plurality of threshold criteria, or "threshold accuracy criteria" (which may be expressed as a percentage). The process of encoding the input dataset is given as an overview in FIG. 1. The input time series data may be univariate, or multivariate. In a multivariate time series data set, each time value in the input data is associated with a plurality of data values, as discussed and exemplified further below.

Figure 1:
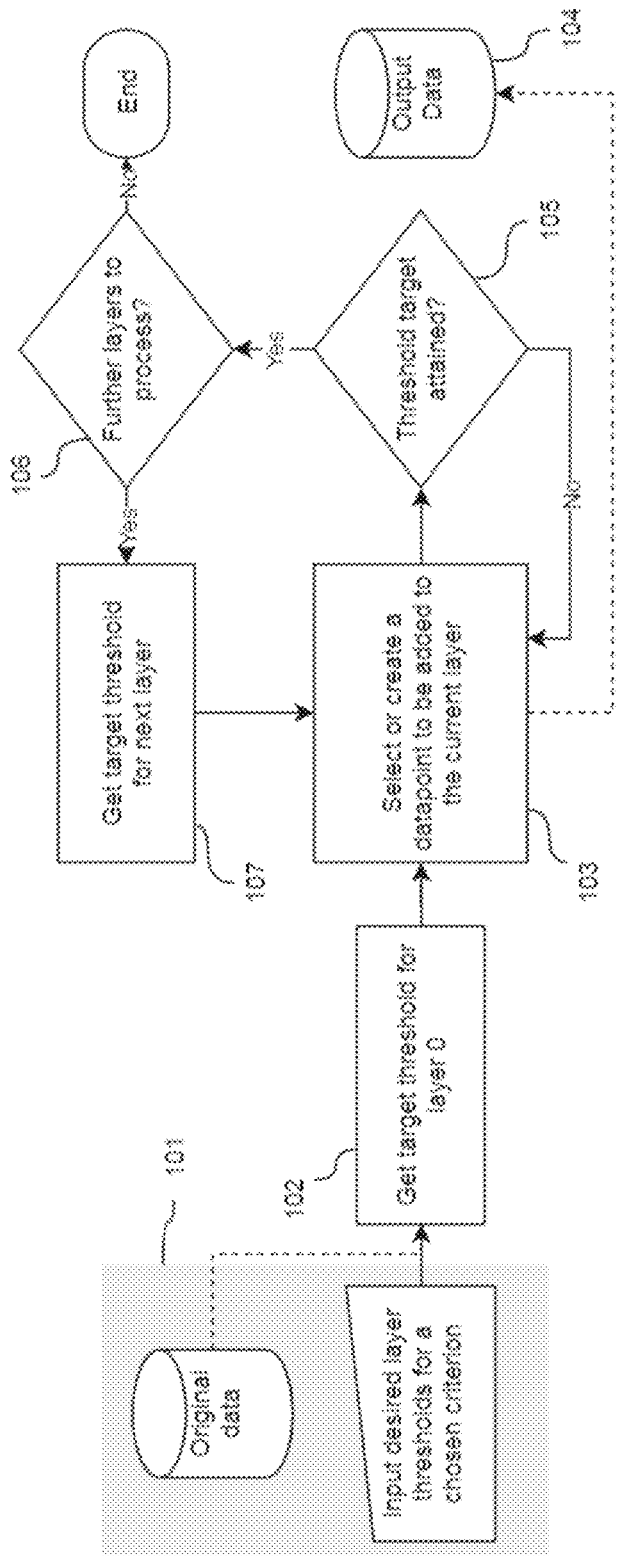
FIG. 1 illustrates a process by which an input set of time series data is encoded.
Figure 2:
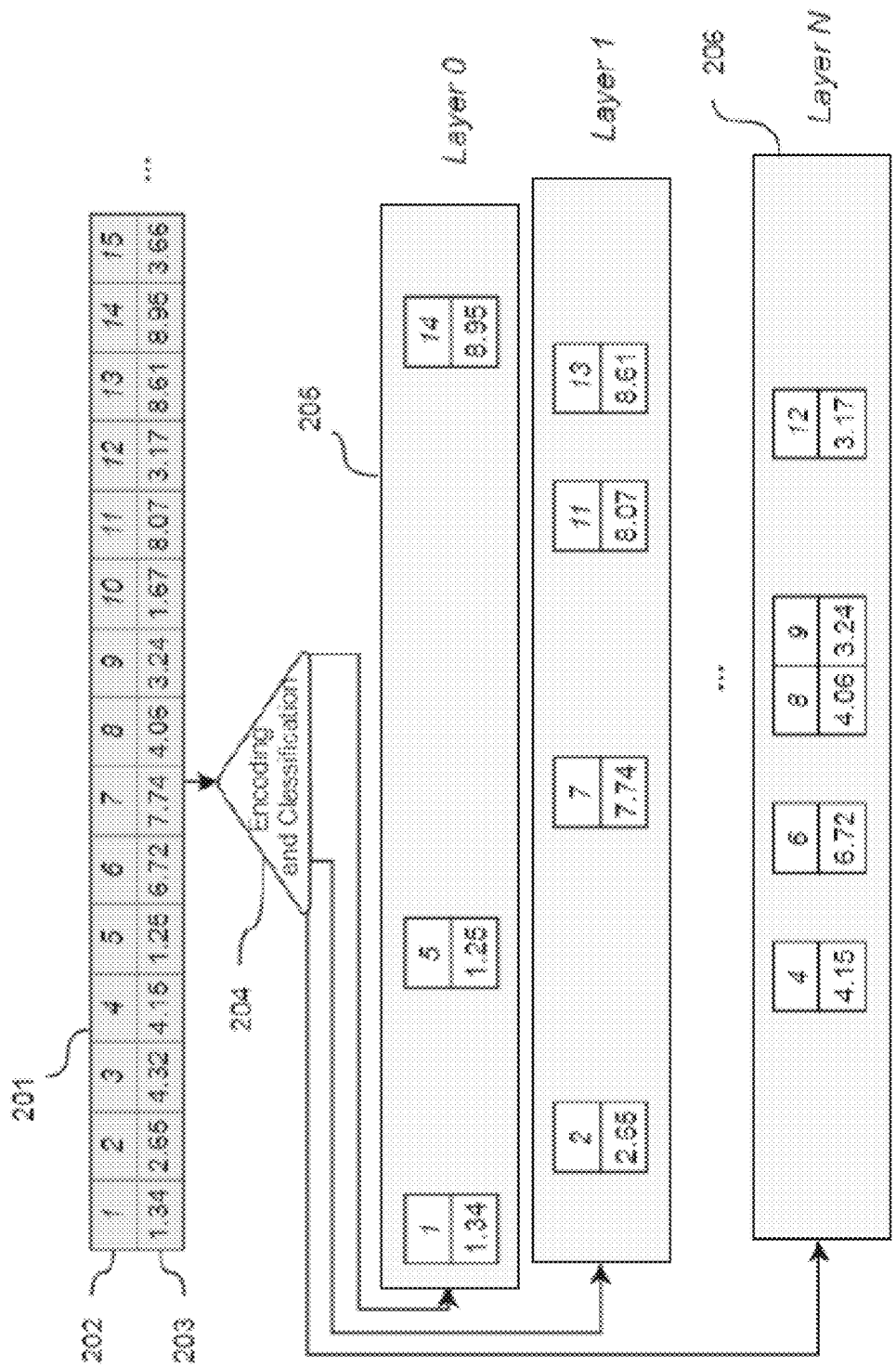
FIG. 2 illustrates an example of an input time series of data and the output after being processed.

Referring to FIG. 1, a time series dataset and a list of one or more desired (incrementally larger) target criteria are received as input data 101 to be encoded. Each one of the target criteria are different to one another. A possible example of the input data is shown in FIG. 2. The target criteria may be represented a statistical measure such as, for example, a list of percentage accuracy thresholds to which the encoded data must match the original data. The method begins, in step 102, by processing the data to conform to the lowest selected criterion threshold. The output of this processing is a subset of the original data referred to hereafter as layer 0.

In order to generate layer 0, in step 103 a data point is selected from the original time series dataset to be included in layer 0. The data point may be labelled with metadata corresponding to its position in layer 0. Alternatively, layer 0 may be stored in its entirety as (for example) an array, or another storage or labelling method may be used. In any case, the labelled or otherwise stored data point becomes part of the output data 104.

In step 105, the resulting layer 0 set is checked to see whether it is representative of the input data to within the specified criterion; if it does not yet meet the criterion threshold, the previous selection step 103 is repeated. This process is iterated until layer 0 meets the required criterion threshold. The term 'meets' in the context of this specification may be interpreted as being the same as or greater than a threshold. This depends on the numerical scoring system used. Typically, high numbers are used to indicate a certain level of accuracy being achieved; however, the scoring system could be inverted such that low numbers are used to indicate a certain level of accuracy. In this example, a score being below a threshold would indicate that the required level of accuracy has been achieved.

The method by which points are selected 103 may vary. For instance, the first selection may be the first data point in the time series data; then, in subsequent iterations, data points are selected which differ from the previous value by more than a threshold amount. As another example, the approaches outlined in U.S. Pat. No. 7,072,812 B2 or U.S. Pat. No. 9,317,483 B2 may be used.

Once the first layer has been encoded into the output data, there may be further layers to process depending on the number of required criteria levels specified by the user input. In step 106, if further layers are required, the method proceeds to step 107; if not the method may end. In step 107, the next highest target criterion threshold will be selected and a new layer will be created. In this case, the iterative process is repeated (i.e. steps 103, 105, 106 and 106 are repeated) with the new target criterion threshold.

For each subsequent layer that is generated, the test in step 105 of whether the desired threshold has been attained also accounts for all previous layers: that is, when testing if layer N fulfils a desired criterion threshold, one considers the union of the data points in layer N with the data points in the other layers 0 to N−1.

In one example, the input time series may be multivariate. In this case, after a data point has been selected and added to a layer, the two or more sets of variables in that layer may be checked against a criterion threshold that takes all variables into account in combination. Alternatively, separate criterion thresholds may exist for each variable type, and layers may need to meet the threshold for one or more of the variable types. Alternatively, separate criterion thresholds may exist for each variable type and subsequently different layer encodings may be performed on the input data for each data type (resulting in a number of encoded output data sets, each in different layers, one for each variable type). Examples of embodiments of the invention utilising a multivariate input time series now follow.

Figure 3:
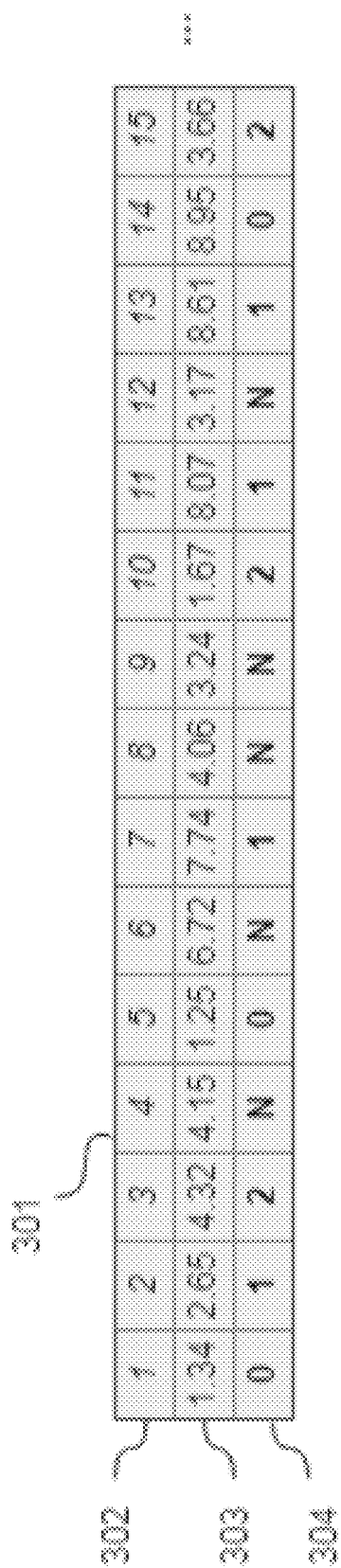
FIG. 3 illustrates an example structure of the encoded data, showing each data point from the original input time series along with the layer to which it belongs.
Figure 4:
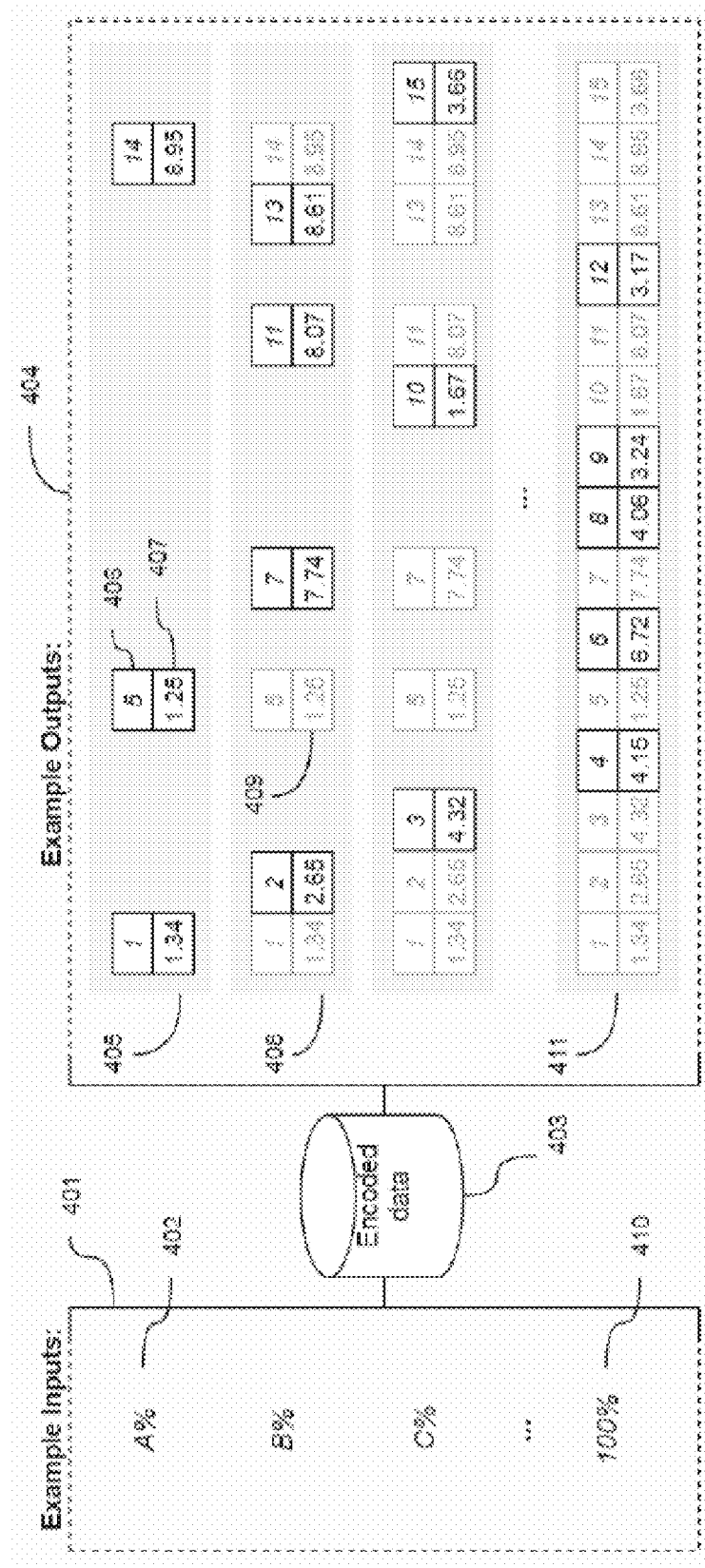
FIG. 4 illustrates example inputs and outputs from querying the encoded dataset with desired accuracy thresholds.

Whereas the examples given elsewhere herein in connection with FIGS. 2 to 4 deal with univariate data (e.g. with reference to FIG. 2, for each time step 202 in the input data 201, there is a single associated data value 203), the principles of the invention may be practiced on multivariate data as well. For example, FIG. 7 shows a first example of input data 701 comprising, for each time step 702, two data values 703a, 703b. In this case, as will be described further below, the first data value 703a represents position offset whilst the second data value 703b represents speed. However, this data is purely exemplary for demonstrating the principles of multivariate data, and other data values representing other types of data may be used instead. FIG. 8 shows a second example of input data 801 comprising, for each time step 802, two data values 803a, 803b. In this case, as will be described further below, the first data value 803a represents a spatial position of an object along an X axis whilst the second data value 803b represents the spatial position of the object along a Y axis. Again, this data is purely exemplary for demonstrating the principles of multivariate data, and other data values representing other types of data may be used instead.

In its simplest form, the application of the principles of the invention on multivariate data may proceed as in the case of univariate data, but in respect of each set of data values (for example, 703a, 703b) separately. In other words, referring to FIG. 7, the input data 701 to be encoded may comprise first and second time series datasets 703a, 703b, and a list of one or more desired (incrementally larger) target criteria which, as above, are different to one another. As above, the target criteria may be represented as a statistical measure such as, for example, a list of percentage accuracy thresholds to which the encoded data must match the original data. In all other respects, a method according to the invention may proceed as described above in respect of univariate data in connection with FIG. 1 and steps 102 to 107, except that the method is performed in respect of two variables, or in other words two time series datasets rather than one. However, even in this example it will be appreciated that further steps may become necessary when applying the target criteria to the first and second time series datasets 703a, 703b, as will now be described.

In the case of univariate data, a single data point is selected from the original time series dataset to be included in layer 0 (see step 103). In the case of multivariate data, the same process can be applied but instead of selecting a single data point, two data points corresponding to the same time step are selected from the original time series dataset to be included in layer 0. As above, the data points may be labelled with metadata corresponding to their position in layer 0 or layer 0 may be stored in its entirety as (for example) an array, or another storage or labelling method may be used. In any case, the labelled or otherwise stored data points become part of the output data. As before, the resulting layer 0 set is checked to see whether it is representative of the input data to within the specified criterion. If the resulting layer 0 does not yet meet the criterion threshold, the selection step is repeated with a further two data points corresponding to the same time step. This process is iterated until layer 0 meets the required criterion threshold.

In the case of multivariate data, when checking whether the resulting layer 0 is representative of the input data to within the specified criterion, a number of possibilities exist. For example, it may be preferred to consider the resulting layer 0 to be representative of the input data if the selected data points of at least a pre-determined one of the two datasets (i.e. variables) is within the specified criterion. For instance, referring to FIG. 7 and to the two time series datasets 703*a*, representing position offset, and 703*b*, representing speed, it may be preferred to consider the resulting layer 0 to be representative of the input data if the selected position offset data points 703*a* meets the required criterion threshold irrespective of whether the selected speed data points 703*b* do. Alternatively, it may be preferred to consider the resulting layer 0 to be representative of the input data if the selected speed data points 703*b* meets the required criterion threshold irrespective of whether the selected position offset data points 703*a* do.

In another example, it may be preferred to consider the resulting layer 0 to be representative of the input data if the selected data points of either of the two datasets is within the specified criterion. For instance, referring again to FIG. 7, it may be preferred to consider the resulting layer 0 to be representative of the input data if either the selected position offset data points 703*a* or the selected speed data points 703*b* meet the required criterion threshold. Alternatively, it may be preferred to consider the resulting layer 0 to be representative of the input data only if the selected data points of both of the two datasets is within the specified criterion. For instance, referring again to FIG. 7, it may be preferred to consider the resulting layer 0 to be representative of the input data only if both the selected position offset data points 703*a* and the selected speed data points 703*b* meet the required criterion threshold.

In any event, the process repeats as described above in connection with univariate data until layer 0 is established, and then repeats as described above in connection with univariate data until all subsequent layers (i.e. layer 1 to layer N) are established.

In the examples given above, it has been assumed that the required criterion threshold is the same for each of the first and second datasets 703*a*, 703*b*, but this need not be the case. Whereas in the examples described above, both datasets 703*a*, 703*b* of the input data used the same list of one or more desired (incrementally larger) target criteria, in another embodiment of the invention there is provided a list of one or more desired (incrementally larger) target criteria for each dataset (i.e. variable) of the input data. For example, again referring to one of the examples given above in connection with FIG. 7, a first list of (incrementally larger) target criteria may be provided for the first dataset 703*a*, and a second list of (incrementally larger) target criteria may be provided for the second dataset 703*b*.

In one example, where separate target criteria are provided for each dataset, it may be preferred to consider the resulting layer 0 to be representative of the input data if the selected data points of the first dataset are within the first specified criterion and/or if the selected data points of the second dataset are within the second specified criterion. For instance, referring again to FIG. 7 and to the two time series datasets 703*a*, representing position offset, and 703*b*, representing speed, it may be preferred to consider the resulting layer 0 to be representative of the input data if the selected position offset data points 703*a* meet the required position offset criterion threshold and/or if the selected speed data points 703*b* meet the required speed criterion. Of course, as described above, in other examples it may be preferred to consider the resulting layer 0 to be representative if the selected data points in a preselected one, or at least one, or both of the datasets 703*a*, 703*b* meet their respective criterion.

It will be appreciated that selecting different threshold criteria for different datasets may be particularly useful in situations where data for one variable is of more importance to a user than the data for another variable. In such cases, the threshold criterion for the variable of most interest can be set higher that the threshold criterion for the variable of least interest, in order to bias the encoding layers into more accurately representing the data of the preferred variable at the expense of the other. In other situations, data for one variable may contain more noise than that of another variable, in which case the threshold criteria may again be adjusted to account for the noisy variable.

Of course, whilst the above examples of multivariate data have been described in respect of the selection of data points for, and subsequent consideration of, the resulting layer 0, the same principles apply in respect of other layers. Moreover, whilst the above examples of multivariate data have been described in connection with only two variables, position offset and speed, the same principles apply in respect of any number of variables.

Figure 9A:
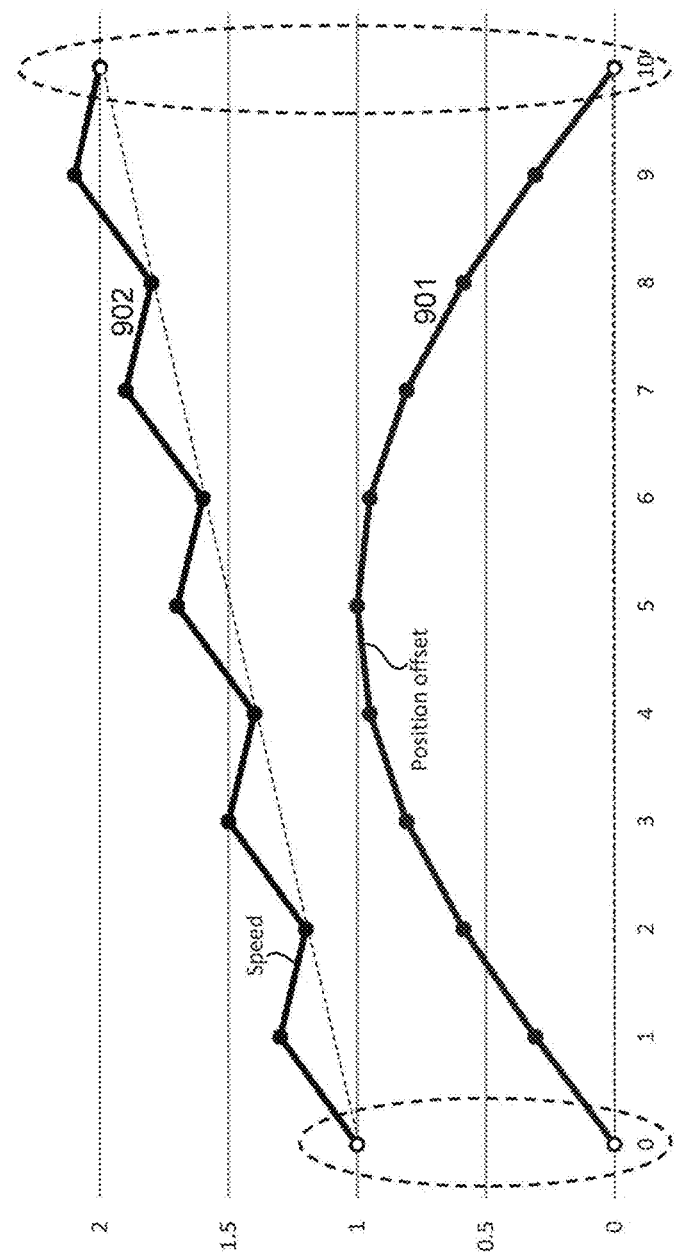
FIG. 9a illustrates an example of an encoding of multivariate data according to one method of determining whether the layer is sufficiently representative of the input data.
Figure 9B:
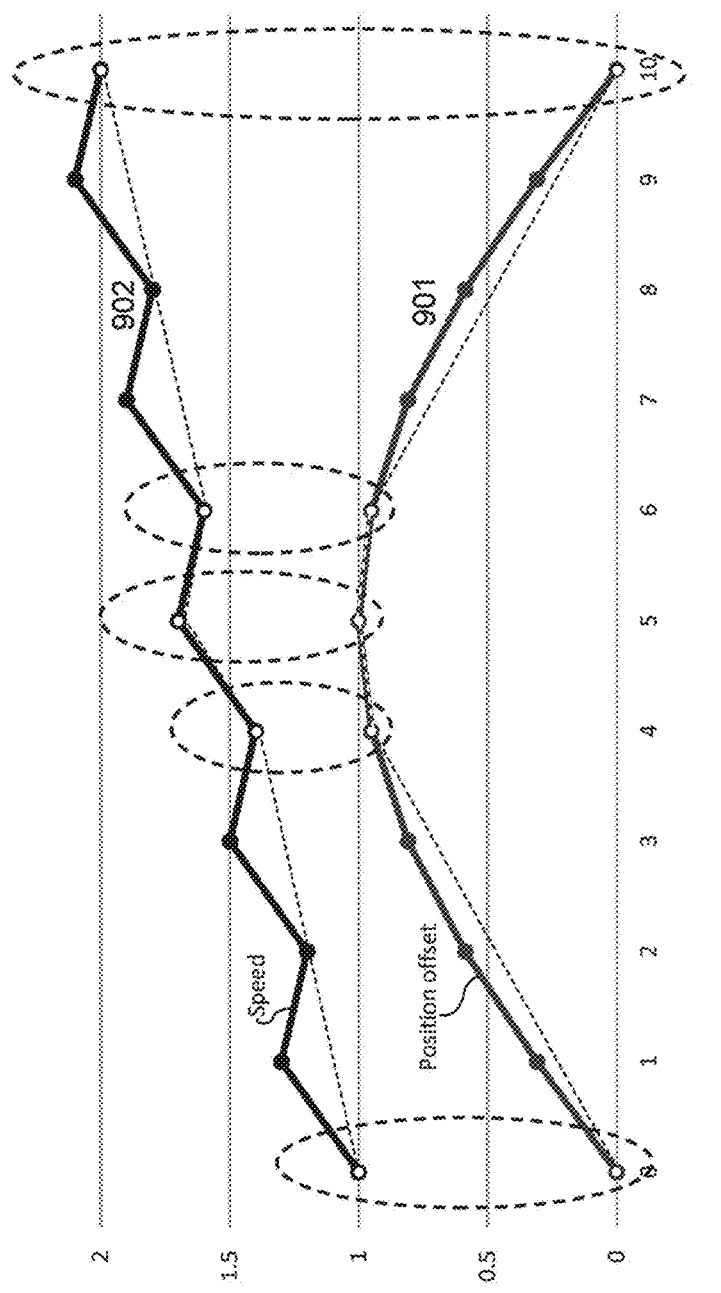
FIG. 9b illustrates an example of an encoding of multivariate data according to another method of determining whether the layer is sufficiently representative of the input data.

FIGS. 9*a*, 9*b* and 9*c* each depict an illustrative example of an aspect of the present invention using the multivariate data found in FIG. 7, according to different embodiments. The input data representing position offset 901 generally follow a curved path, and the input data representing speed 902 generally follow a zigzag path. Data points which are included in a layer are shown as a lighter colour, and pairs of such data points (in the case of FIGS. 9*a* and 9*b*) are shown encircled by a dashed ellipse. Dashed interpolation lines have been drawn to further distinguish points in the layer, and to provide an illustration of the layer's fidelity to the input data.

FIG. 9*a* illustrates the case where determining whether a layer is sufficiently representative of the input data comprises determining whether the selected set of data values for either of the two variables falls within a specified criterion, and the criterion is the same for each variable. In this particular instance, the criterion that a selected set of data values must meet is that its average lies within 10% of the average of the data values for that variable in the input data. Here, we see that after one iteration, the layer 0 only contains data for the points at time t=0 and time t=10. This means that the average position offset value for the layer is 0, and the average speed value for the layer is 1.5. Since the average of all position offset values in the input data is 0.574, and 0 is not within 10% of this value, the position offset data fails to meet the specified criterion. However, the average of the speed values in the input data is ~1.59, and since 1.5 is within 10% of this value, the speed data for the layer meets the necessary criterion, and so the layer as a whole is determined to be sufficiently representative of the input data.

FIG. 9*b* illustrates the case where determining whether a layer is sufficiently representative of the input data comprises determining whether the selected set of data values falls within a specified criterion for both of the two variables, and a separate criterion is used for each variable. In this particular instance, the threshold for position offset data is 2%, and the threshold for speed data is 5%. After a number of iterations, the layer contains data for the points at t=0, 4, 5, 6, 10, which means that the average position offset value for the layer is 0.5804, and the average speed value for the layer is 1.54. These values are within 2% and 5% respectively of the average position offset and speed values of the input data (0.574 and ~1.59), and hence the layer meets the criteria for both of the two variables independently; therefore, it is determined to be sufficiently representative of the input data.

FIG. 9c illustrates the case where separate criteria exist for each variable, and separate layer encodings are created for each variable—that is, the input data is essentially split into two distinct series, each of which is encoded into one or more layers using the abovementioned techniques for working with univariate data. In this particular instance, after a number of iterations we have a layer of position offset data comprising values taken at t=0, 4, 5, 6, 10, as well as a layer of speed data comprising values taken at t=0, 3, 7, 10. The threshold criterion for position offset data is that the layer's average must lie within 2% of the input position offset data average, and the threshold criterion for speed data is that the layer's average must lie within 1% of the input speed data average. It can be easily checked that each of these layers satisfies its respective criterion. Moreover, it should be noted that, although some data is effectively "lost" in the splitting up of the position offset and speed data (i.e. position offset values for t=3, 7 and speed values for t=4, 5, 6), splitting it up in this way achieves the result that tighter thresholds can be met than in the previous example, while having to store fewer data values (5 position offset values and 4 speed values, compared to 5 pairs of values stored by the example of FIG. 9b).

The examples given above in connection with multivariate data and FIG. 7 apply to a setting where the input data comprises data about the position offset of an entity and its speed. However, this need not be the case. The methods and techniques set out herein are also applicable to sets of input data gathered from a wide range of sensors; for example, the input data may comprise values for the power consumption and temperature of an electrical or electronic device, or the rotational speed and vibration of an engine or generator. It will be appreciated that these methods and techniques are particularly useful for the compression of large multivariate datasets in which one or more of the variables contains a high degree of noise. Such a dataset might arise in any one of a number of industrial applications involving generation of data by sensors in real time, such as travel, logistics, engineering, energy, manufacturing or health. Such data may be generated by IoT (internet of things) edge devices, as will be discussed in more detail later.

The examples given above in connection with multivariate data and FIG. 7 have assumed that each variable is to be treated separately. However, this need not be the case. Referring now to FIG. 8, a further embodiment involving multivariate data will be described. Whereas the two datasets described in connection with FIG. 7 were treated separately insofar as the steps of comparing each to a threshold criterion or a respective threshold criterion were concerned, it is possible instead to treat multiple data points corresponding to the same time step together, or to perform a mathematical function on them, to result in a single data point for each time step. Once this treatment has been performed, the method can then proceed as described previously in respect of univariate data.

By way of example with reference to FIG. 8, input data 801 refers to position data and comprises a first time series dataset 803a referring to position of an object along an X axis and a second time series dataset 803b referring to position of an object along a Y axis. Whilst it would be possible to treat each of these time series datasets separately as described above in connection with FIG. 7, an alternative approach is to treat them together such that there is effectively a single data point—position—for each time step. As with the previous example therefore, in all other respects, a method according to the invention may proceed as described above in respect of univariate data in connection with FIG. 1 and steps 102 to 107. However, even in this example it will again be appreciated that further steps may become necessary when applying the target criteria to the combined time series datasets 803a, 803b, as will now be described.

Whereas the criterion in respect of datasets 701a, 701b effectively take into account either one or two variables as they change over time, and the fidelity of a selection of the data points in each dataset (i.e. which make up a layer) with respect to the input data as it too changes over time, the criterion in respect of datasets 801a, 801b effectively takes into account one of the two variables as it changes with respect to the other of the two variables, and the fidelity of a selection of the data points with respect to the input data as it too relates to the relationship between the two variables. For instance, referring to FIG. 8, dataset 803a representing position along an X axis and dataset 803b representing position along a Y axis could either be treated as two separate time series datasets whose data points can each be selected separately such that the resulting layer 0 is compared against the respective variable in the input data (as described above in connection with FIG. 7 and datasets 703a, 703b), or the datasets 803a, 803b can be considered together to determine, for each time step, a position, which can itself be selected such that the resulting layer 0 is compared against position as determined in the input data.

In more detail, in order to generate layer 0, two data points corresponding to the same time step are selected from the original time series dataset to be included in layer 0. As above, the data points may be labelled with metadata corresponding to its position in layer 0 or layer 0 may be stored in its entirety as (for example) an array, or another storage or labelling method may be used. In any case, the labelled or otherwise stored data points become part of the output data. As before, the resulting layer 0 set is checked to see whether it is representative of the input data to within the specified criterion. If the resulting layer 0 does not yet meet the criterion threshold, the selection step is repeated with a further two data points corresponding to the same time step. This process is iterated until layer 0 meets the required criterion threshold.

In establishing whether layer 0 meets the required criterion threshold, first of all the position represented by the selected data points is determined, based upon position along an X axis (represented by the first data point of the time step) and position along a Y axis (represented by the second data point of the time step). This determined position (or multiplicity of positions, in the case where multiple points have been selected), rather than the data points separately, is then used to determine whether the resulting layer 0 set is representative of the input data to within the specified criterion. It will be appreciated that the determination will require a comparison to be made with the positions in the input data, rather than with the data points of the input data which separately represent position along an X axis and position along a Y axis.

Of course, whilst the above examples of multivariate data have been described in respect of the selection of data points for, and subsequent consideration of, the resulting layer 0, the same principles apply in respect of other layers. Moreover, whilst the above examples of multivariate data have been described in connection with only two variables, X position and Y position, the same principles apply in respect of any number of variables or axes.

Figure 10A:
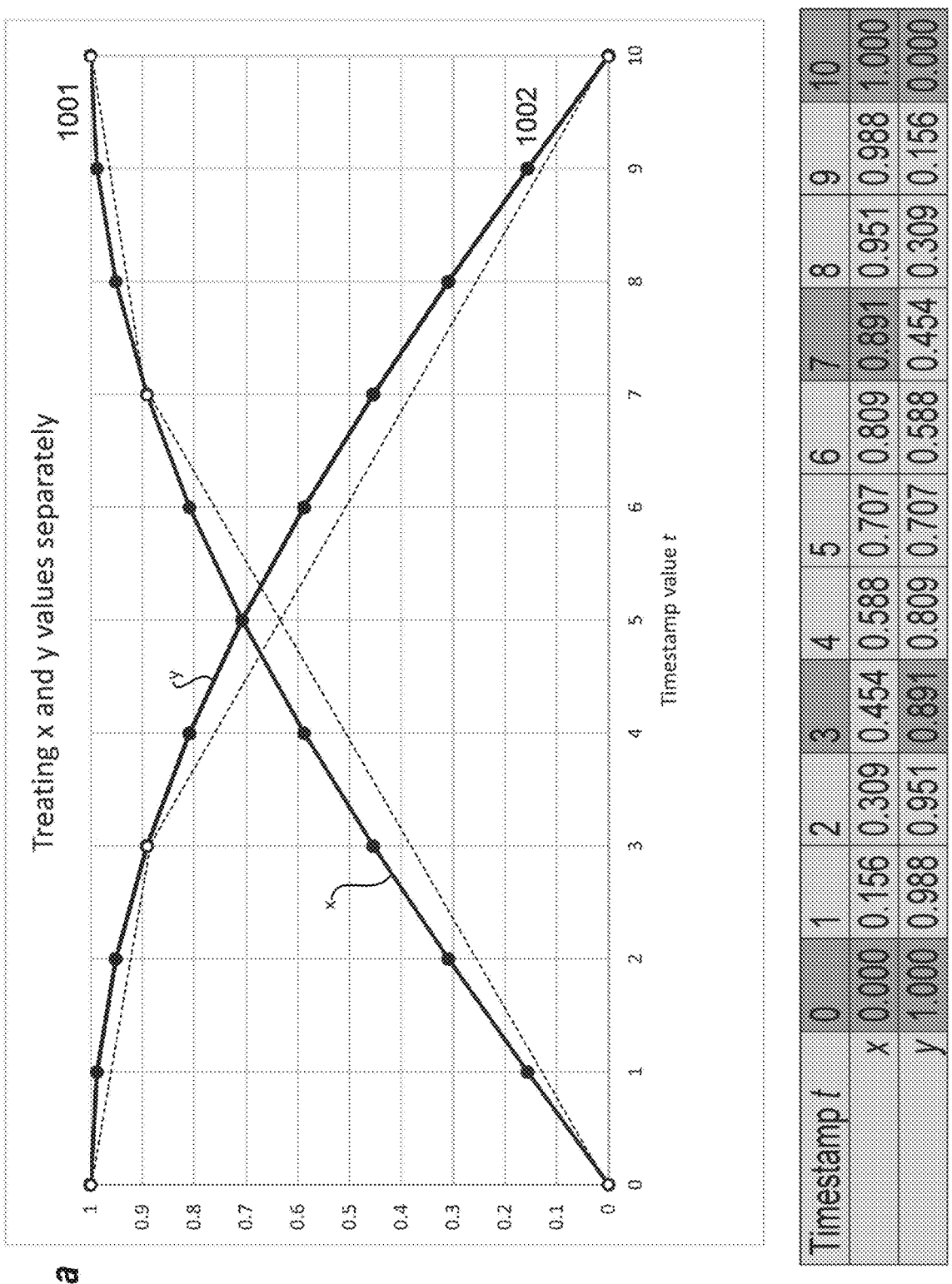
FIG. 10a illustrates an example of an encoding of an alternative set of multivariate data according to one method of determining whether the layer is sufficiently representative of the input data.
Figure 10B:
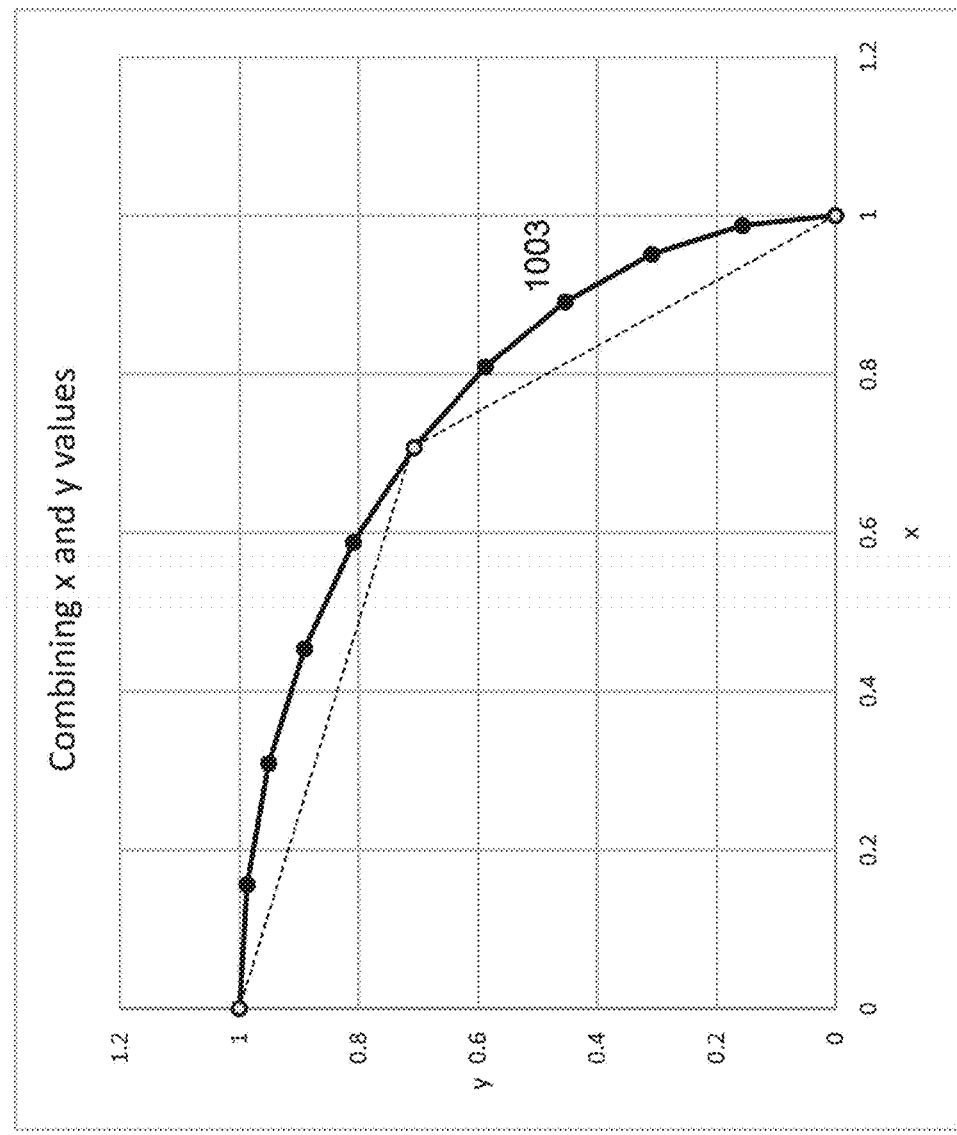
FIG. 10b illustrates an example of an encoding of the alternative set of multivariate data according to another method of determining whether the layer is sufficiently representative of the input data.

FIGS. 10*a* and 10*b* each depict an illustrative example of an aspect of the present invention using the multivariate data found in FIG. 8, according to different embodiments. In FIG. 10*a*, there can be seen input data representing the coordinate x 1001, which increases over time, and input data representing the coordinate y 1002, which decreases over time. In FIG. 10*b*, there can be seen points on the plane represented by pairs of (x, y) values. In both figures, data points which are included in a layer are shown in a lighter colour. Dashed interpolation lines have been drawn to further distinguish points in the layer, and to provide an illustration of the layer's fidelity to the input data.

FIG. 10*a* illustrates an example of the case where each variable in the multivariate data is treated separately. In this instance, separate layer encodings exist for both x and y, and determining whether each layer is sufficiently representative of the input data involves analysis of the data for each of the two variables independently and in isolation, as described above in connection with FIGS. 9*a* to 9*c*. Specifically, the average of the values in the layer of x data must lie within 2% of the average of the values for x in the input data, and the average of the values in the layer of y data must lie within 2% of the average of the values for y in the input data. It can readily be seen that, since each layer has an average value of ~0.630, and the input data for each variable averages ~0.623, both layers meet their respective threshold criterion.

FIG. 10*b* illustrates an example of the case where the values for each time series in the multivariate data are taken together in combination. In this instance, the layer is comprised of pairs of x and y values together, each pair representing a position in the 2-dimensional Cartesian plane. It is these positions which are used to determine whether the layer is sufficiently representative of the input data. Criteria for deciding this may, by way of non-limiting example, involve computing one or more measures of distance between the input data points 1003 and the line interpolating between the layer points (depicted as a dashed line here). Alternatively, criteria may be based upon the geometric area between the interpolation of the input data points and the interpolation of the layer points. It will be recognised by those skilled in the art that these examples are merely illustrative and that many other such geometric threshold criteria could be used to determine whether the layer is sufficiently representative of the input data without departing from the scope of the present invention.

It will be appreciated that, in a setting where the user wishes to keep both the x and y values for each stored data point (e.g. for audit purposes, or because they wish to plot their data on a graph), treating each data point as a whole as seen in FIG. 10*b* is able to lead to a more efficient and suitable compression of data than compressing by each variable separately, as is seen in FIG. 10*a*. Were a user to compress both x and y independently as shown in FIG. 10*a*, and then extend the layer to include both x and y values for each stored timestamp, it can be seen that a total of 4 pairs of values would need to be stored. Conversely, the technique illustrated in FIG. 10*b*, whereby each pair of values is treated as a geometric point, leads to an encoded layer of points which contains fewer data values, whilst still providing an adequate representation of the underlying input data.

One particularly useful application of the embodiment illustrated by FIGS. 8 and 10*b*, whereby all the values for a multivariate data point are taken together in combination when deciding whether a layer meets a threshold criterion, is in the field of geolocation. By treating the data points as geometric points in space (e.g. Cartesian coordinates, polar coordinates, latitude, longitude and/or altitude coordinates) one can define measures of distance therebetween (e.g. Euclidean distance in the case of Cartesian coordinates, great-circle distance in the case of latitude and longitude) and use these to determine whether a selected or generated dataset is sufficiently representative of the input data overall in accordance with the methods and techniques outlined above. For instance, one might use this embodiment when working with data from one or more location sensors on a car, train, or ship, which may produce an excessively large quantity of data as well as a high degree of noise. By treating the geolocation data generated by the sensor(s) as a set of points on the Earth's surface, the dataset can be compressed to a reduced set of points which follow the same approximate path, while taking into account the Earth's curvature along the defined path.

In a variation on the processes described above, instead of a data point being selected from the original time series dataset 103 or data sets 703, 803, a data point may be created and added to the layer being encoded. This value of the data point may be calculated or inferred by a number of methods, for instance using linear or non-linear interpolation between neighbouring data points. This variation may be suitable where the dataset is not required to be comprised of data selected from the original time series data, for instance where auditability is of no concern. In this case the data may not be cumulable, as intermediate data points have been created that were not present in the original time series data.

FIG. 2 shows an example of an input time series of data, and some possible output layers following encoding according to the process in FIG. 1 (using any chosen method for selecting the points in each layer). The example input data 201 comprises values denoting a time-step 202 and a data value 203. In an example application, this data may comprise a date-time value (which need not be evenly spaced) and a corresponding measurement value from a measuring device.

Following encoding of the input time series data 204 according to the process in FIG. 1, the example data may be split into N layers according to N input thresholds supplied by the user. In this example, the chosen criterion may be accuracy to the original dataset (with each layer being closer in accuracy to the original time series data), and the lowest accuracy layer may be labelled 'layer 0' and contains a subset of the original time series data 205. In this example case, this is illustrated with the inclusion of the data from time-steps 1, 5, and 14.

Subsequent layers include data points from other time-steps. The final layer N 206 may, in some embodiments, contain any other data points not included in previous data layers: in this case the example encoded data layers are cumulable, and the original input data series can be recovered by the union of all encoded data layers from 0 to N.

An example of how the encoded data may be stored is shown in FIG. 3. Here, the output data 301 is stored as an array with time-steps ordered as in the original input data series 302, values corresponding to each time step 303, and newly created metadata indicating to which layer each data point belongs 304. In this example, the data point at time-step 0 belongs to layer 0; the point at step 7 belongs to layer 1; and the point at step 9 belongs to layer N. Other methods of storing the encoded data may be used as alternatives.

In an example implementation, there may be multiple criteria that require encoding. For instance, the user may require data conforming to specified accuracy thresholds, such as those referred to above. In this example, the process may be repeated on the data to construct multiple layers for each required criterion. These may be stored as metadata (as in the example in FIG. 3), but with additional rows indicating the layer to which a data point belongs for each of the different criteria selected. Other methods of storing the data may also be implemented.

In order for a user to interrogate or display data from the encoded dataset to within a desired threshold of a criterion (for instance accuracy calculated in the manner described above, or calculated in any other suitable manner), the layers and their corresponding thresholds can be used. FIG. 4 shows an example of possible accuracy threshold percentages being used to query the encoded dataset, and the corresponding outputs returned.

Different layers can be returned according to desired user inputs 401. These inputs may be percentage thresholds for accuracy: for instance, the user may require a subset of the data that represent the original time-series data to within A % 402. The encoded dataset 403 can then be queried to return the correct subset of data 404 that fulfils the required accuracy percentage but requires only a small fraction of the original time series data: representing significant data compression.

For example, if the value of A is below the percentage accuracy used when generating the encoded layer 0, then layer 0 can be returned as the output corresponding to this input 405. This comprises the data points within layer 0, each of which retains a time-step value 406 and, for example, a measurement value recorded at that time-step 407.

If the input percentage threshold exceeds that of layer 0, additional layers can be returned in the output. If the input threshold is, for instance, above the threshold of layer 0 but below that of layer 2 (B %), the corresponding output 408 comprises the union of data points in layer 0 and layer 1.

In the example, data points from layers below the layer with the highest threshold accuracy are shown in grey. For instance, the data point from the 5th time-step 409 belongs to layer 0 but is returned with higher layers (1 to N) if they are required.

In one example, the encoded data is cumulable: and the original time series data can be recovered in its entirety from the encoded data. This is shown in FIG. 4 in the case where the desired accuracy threshold is 100% 410. Here, the union of the highest layer and all layers below is returned 411. This corresponds to the original time series dataset.

In one example, the encoded data is multivariate and exists in different encoded datasets (each with a layer structure) for each variable type. These may then be queried according to the method above, specifying the threshold and a variable type.

In one example, there may be one or more additional steps once the data has been encoded as described. In an example, there may be a process following the completion of a 'layer' whereby data points are systematically tested and removed, if their presence in the layer does not contribute to the layer's criterion threshold being above the user input threshold. In more detail, it can be envisioned that a data point was included during the layer's construction that initially increased (for example) the accuracy of that layer, but which (upon the layer's completion) is no longer as important because of the data points selected subsequently during the creation process. These extraneous data points may then be moved to higher layers, resulting in further compression benefits.

Figure 5:
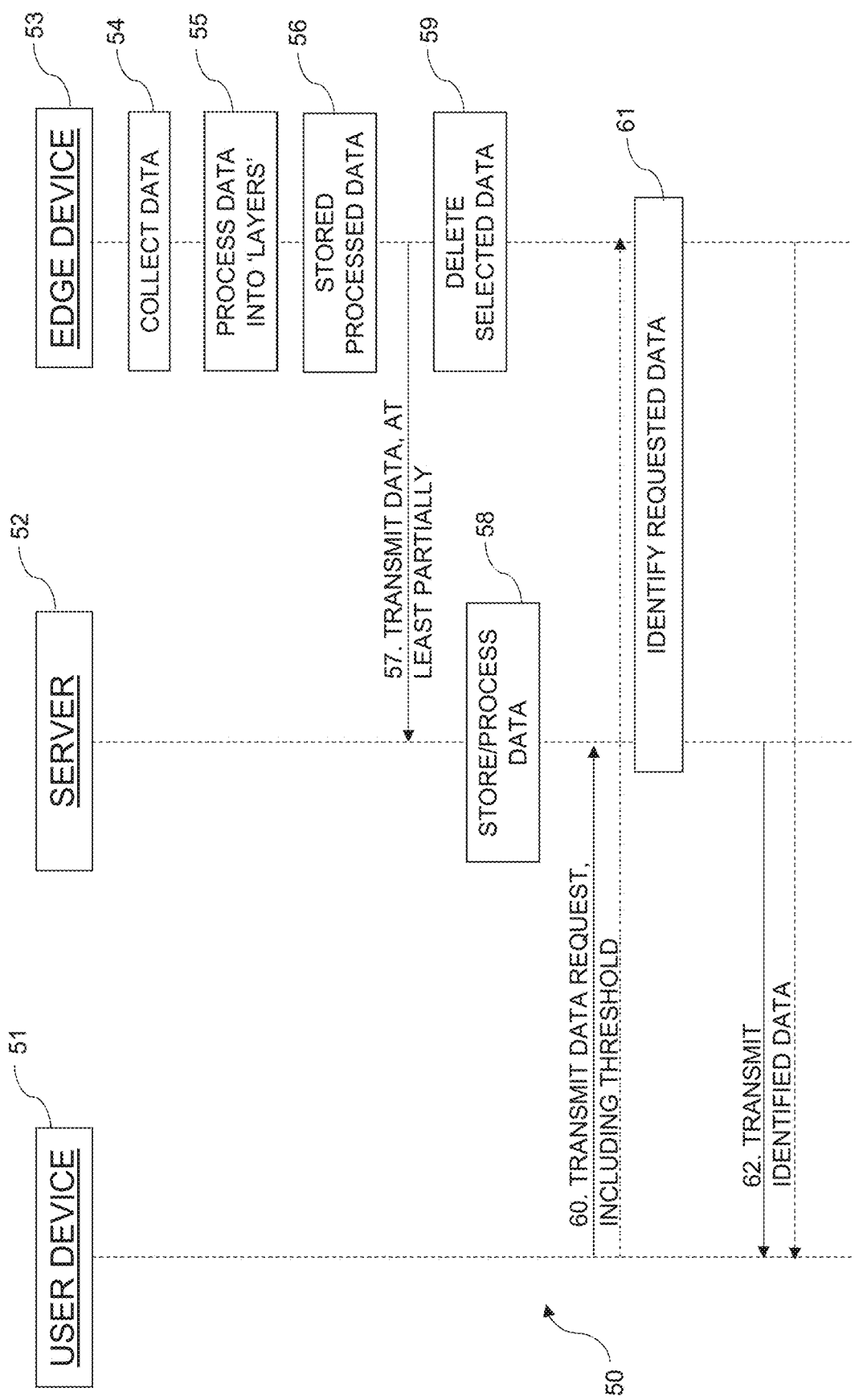
FIG. 5 illustrates an example of a data processing system.

Referring to FIG. 5, there is a system 50 for executing the processes described above. The system 50 comprises a user device 51, a server 52 and an edge device 53. In the system 50, the edge device 53 is for example an IoT device that includes at least one sensor and generates the input data from the sensor readings. The server 52 is for storing at least some of the input data, or a subset of the data generated by the edge device 53. The user device 51 is for retrieving the data generated by the edge device 53 either from the server 52, or from the edge device 53 itself.

In step 54, the edge device 53 generates the input data. Then, in step 55 the edge device 53 processes the input data into layers in the manner described above (e.g. according to steps 101-107). Once the input data has been processed, in step 56 the processed data is stored in memory at the edge device 53.

In step 57, the edge device 53 transmits the stored data that has been processed into layers to the server 52. Alternatively, the edge device 53 transmits the original input data from which the layers were processed to the server 52. In this alternative, the step of processing the data is optional.

In step 58, the server 52 stores the data that the edge device 53 has sent to it in memory at the server 52. In the example where the edge device 53 processes the data into layers, the server 52 stores the processed layers in step 58. However, in the example where the edge device 53 does not perform the processing, the server 52 stores the original input data in memory. In step 58, if the edge device 53 does not perform the processing, the server 52 performs the functions of step 55. In another example, some of the processing involved in generating the layers is performed at the edge device 53 and some of the processing is performed at the server 52. Thus, it is possible to share the processing load between the edge device 53 and the server 52.

In step 60, the user device 60 transmits a request for data to either the server 52, the edge device 53, or both. The request includes at least one indicator of a threshold criterion to which the data must meet. In step 61, the server 52, or the edge device 53, identifies the dataset that meets the requests criterion. If the request is sent to the server 52, and some or all of the requested data is not stored at the server 52, the required set or subset of data can be identified at the edge device 53. Alternatively, if the request is sent to the edge device 53, and the requested data is not stored at the edge device 52, the requested data can be identified at the server 52.

In step 62, the identified data is sent to the user device 51 for display, processing or storage at the user device 52 and/or at another device.

In one illustrative example for IoT edge devices, it is important to maximise the use of the bandwidth. For instance, in the case of a connected car producing ~10 Mbps of sensor data, the data can be analysed at the car itself and only data having 90% accuracy to the original input data may be sent wirelessly to another device, such as a server. However, the amount of storage capacity on the car may be limited. Therefore, in addition to selecting a subset of the input data in order to optimise bandwidth usage, it is possible to optimise what is stored at the car. For example, only the data required for 90% accuracy may be transmitted, and only data required for 90% to 99% accuracy may be stored locally. The remaining data may be deleted. In other words, the data required for 100% accuracy is not stored at the car or at an external device (i.e. it is deleted). This optimises both storage and bandwidth usage.

In another illustrative example, an aircraft engine produces a large amount of data from sensors monitoring the engine. Due to bandwidth limitations, obtaining data on the ground that is 90% accurate to the original data may be extremely difficult. Therefore, the airline may accept 80% accuracy as a baseline level of accuracy. However if a local process detects a potential problem with the engine, then device can be triggered to change the level of accuracy of the data being transmitted from the aircraft.

For example, under normal operating circumstances the engine vibration data for an engine on the aircraft is sent at 80% accuracy. However, a local process may determine that the engine vibration data has spiked above a pre-set threshold. This may be indicative that that a fault has occurred that an operator on the ground might need to diagnose. To aid the operator, the device may switch from sending data at 80% accuracy to sending data at 95% accuracy. In addition, the operator may receive an alert that a fault may have occurred. The operator can then assess data at 95% accuracy data to help diagnose the fault. This local control could also trigger the device to send data at 95% accuracy for a period of time before the fault was detected.

Figure 6:
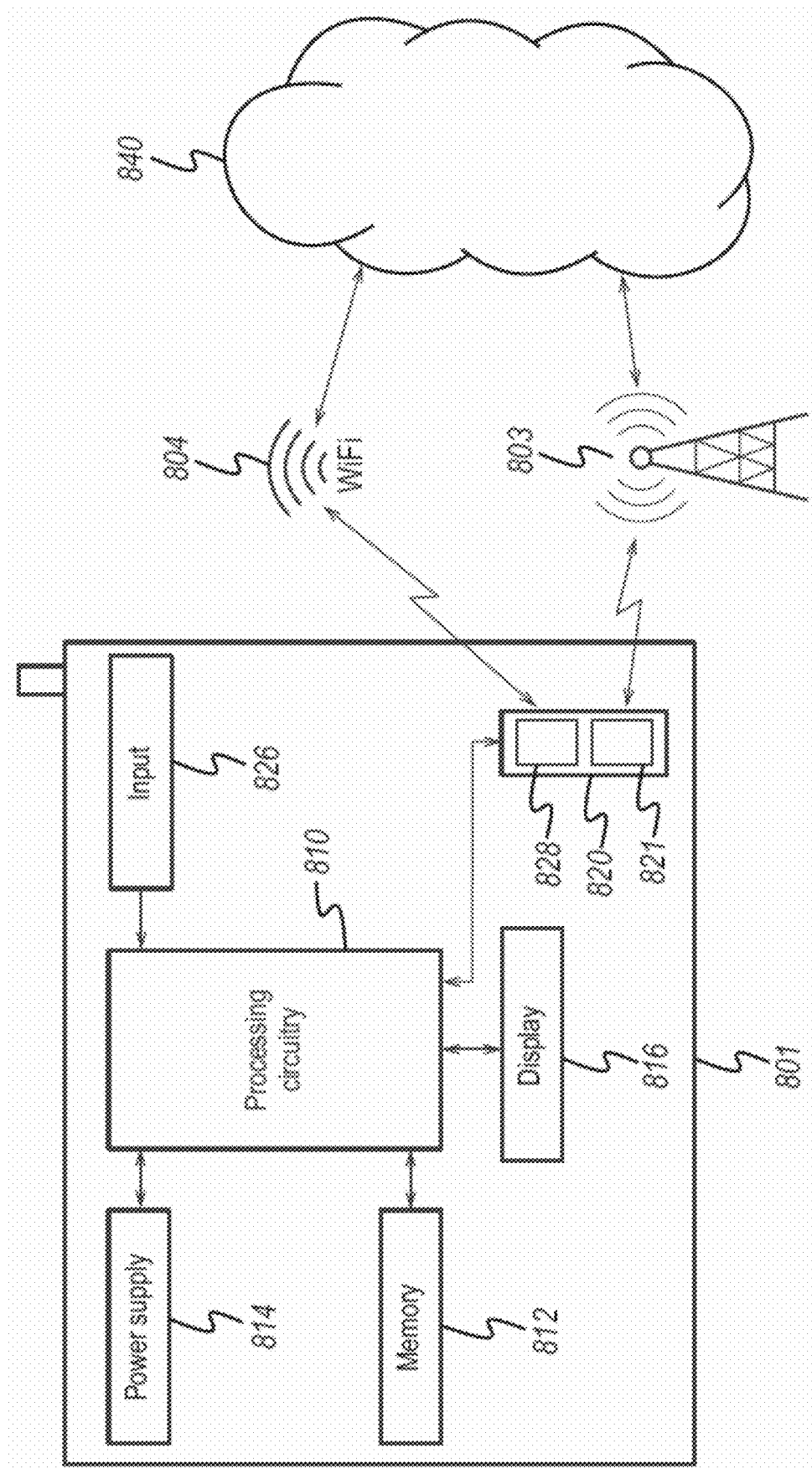
FIG. 6 illustrates another example of a data processing system.

FIG. 6 shows an exemplary electronic device 801 that is configured to carry out the method described herein. The electronic device 801 comprises processing circuitry 810 (such as a processor, a "processing module") and a memory 812. Electronic device 801 may also comprise one or more of the following subsystems: a power supply 814, a display 816, a wireless transceiver 820, and an input 826 (or an "input module"). The processing module 810 may be configured to execute steps of the method described above, such as steps 103, 104, 105, 106 and 107. The input module 826 may be configured to execute steps of the method described above, such as steps 101 and 102. The datasets that are selected, or generated, by the processing module 810 can be stored in the memory 812.

Processing circuitry 810 may control the operation of the electronic device 801 and the subsystems 812-828. Processor 810 is communicatively coupled with subsystems 812-828. Memory 812 may comprise one or more of random access memory (RAM), read only memory (ROM), non-volatile random access memory (NVRAM), flash memory, other volatile memory, and other non-volatile memory.

Display 816 may be communicatively coupled with the processing circuitry 810, which may be configured to cause the display 816 to output images. The display 816 may comprise a touch sensitive interface, such as a touch screen display. The display 816 may be used to interact with software that runs on the processor 810 of the electronic device 801. The touch sensitive interface permits a user to provide input to the processing circuitry 810 via a discreet touch, touches, or one or more gestures for controlling the operation of the processing circuitry and the functions described herein. It will be appreciated that other forms of input interface may additionally or alternatively be employed for the same purpose, such as the input 826 which may comprise a keyboard or a mouse at the input device.

The transceiver 820 may comprise one or more long-range RF transceivers that are configured to operate according to communication standard such as LTE, UMTS, 3G, EDGE, GPRS, GSM, and Wi-Fi. For example, electronic device 801 may comprise a first long-range wireless transceiver 821, such as a cellular transceiver, that is configured to communicate with a cell tower 803 via to a cellular data protocol such as LTE, UMTS, 3G, EDGE, GPRS, or GSM, and a second long-range wireless transceiver 828, such as a Wi-Fi transceiver, that is configured to communicate with a wireless access point 804 via to a Wi-Fi standard such as 802.11 ac/n/g/b/a. In this regard and for the purposes of all embodiments herein concerning a long-range wireless protocol, a long-range wireless protocol may be a protocol which is capable and designed for communication over 5, 10, 20, 30, 40, 50, or 100 m. This is in contrast to short-range wireless protocol mentioned above. The long-range wireless protocol may communicate utilizing higher power than the short-range wireless protocol. The range (e.g. line of sight distance) between the long-range end nodes (electronic device and router or base station) for the long-range wireless protocol may be greater than the range (e.g. line of sight distance) between the short-range end nodes (e.g. electronic device and wireless beacon).

Electronic device 801 may be configured to communicate via the long-range wireless transceiver 820 with a network 840. Network 840 may be the cloud network 3 or any such wide area network, such as the internet, or a local area network. Electronic device 801 may be further configured to communicate via long-range wireless transceiver 820 and network 840 with one or more servers or user devices.

The term "comprising" encompasses "including" as well as "consisting" e.g. a composition "comprising" X may consist exclusively of X or may include something additional e.g. X+Y.

Unless otherwise indicated each embodiment as described herein may be combined with another embodiment as described herein.

The methods described herein may be performed by software in machine readable form on a tangible storage medium e.g. in the form of a computer program comprising computer program code means adapted to perform all the steps of any of the methods described herein when the program is run on a computer and where the computer program may be embodied on a computer readable medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously. This acknowledges that firmware and software can be valuable, separately tradable commodities. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

It will be appreciated that the modules described herein may be implemented in hardware or in software. Furthermore, the modules may be implemented at various locations throughout the system.

Those skilled in the art will realise that storage devices utilised to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realise that by utilizing conventional techniques known to those skilled in the art that all, or a portion of the software instructions may be carried out by a dedicated circuit, such as a DSP, programmable logic array, or the like.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought. Any of the module described above may be implemented in hardware or software.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the scope of this invention.

The following is a non-exhaustive list of embodiments of the invention which may or may not be claimed.

1. A computer-implemented method comprising:
   obtaining input data comprising a plurality of data values, wherein each data value is associated with a time value;
   obtaining a plurality of threshold criteria; and
   (a) selecting, or generating, a dataset or a plurality of datasets that are different to one another from the input data, and determining whether each selected, or generated dataset meets a threshold criterion of the plurality of threshold criteria; and
   (b) causing each selected, or generated, dataset that meets the threshold criterion to be stored in memory in association with the threshold criterion,
   repeating (a) and (b) for each threshold criterion of the plurality of threshold criteria, thus causing a plurality of datasets to be stored in the memory, wherein each stored dataset meets a threshold criterion of the plurality of threshold criteria; and
   wherein each stored dataset comprises a plurality of data values and an indication of the time value associated with each one of the plurality of data values.

2. The computer-implemented method of embodiment 1 wherein each threshold criterion is a desired level of similarity between a dataset and the input data.

3. The computer-implemented method of embodiment 1 or embodiment 2, wherein each threshold criterion is a desired level of fidelity of a dataset to the input data.

4. The computer-implemented method of any one of the preceding embodiments wherein each threshold criterion is a desired level of accuracy with which a dataset represents the input data.

5. The computer-implemented method of any one of the preceding embodiments wherein each threshold criterion is expressed as a percentage.

6. The computer-implemented method of any one of the preceding embodiments wherein determining whether a selected, or generated, dataset meets a threshold criterion comprises:
   calculating a first average of the data values in the dataset;
   calculating a second average of the data values in the input data;
   calculating an accuracy score by determining a difference between the first average and the second average and dividing the difference by the second average;
   determining whether the accuracy score meets the threshold criterion.

7. The computer-implemented method any one of the preceding embodiments wherein selecting one or more datasets from the input data comprises:
   selecting a subset of the input data, for each dataset, wherein the subset comprises not all of the plurality of data values from the input data.

8. The computer-implemented method any one of the preceding embodiments wherein generating one or more datasets from the input data comprises calculating, or inferring, data values from the data values of the input data.

9. The computer-implemented method of embodiment 8 further comprising using linear interpolation, or non-linear interpolation, to calculate, or infer, data values from the data values of the input data.

10. The computer-implemented method of any one of the preceding embodiments wherein selecting, or generating, one or more datasets comprises selecting, or generating, a dataset that differs from at least one previously selected, or generated, dataset by greater than, or less than, a threshold amount.

11. The computer-implemented method of any one of the preceding embodiments wherein all of the data values taken from all of the stored datasets are the same as all of the data values from the input data, such that the stored datasets can be combined to form the input data.

12. The computer-implemented method of any one of the preceding embodiments wherein causing the dataset that meets the threshold criterion to be stored comprises:
   identifying at least one data value associated with a time value in the dataset to be stored that is duplicated in another dataset that is stored in the memory; and
   preventing the identified data value from being stored in the memory.

13. The computer-implemented method of any one of the preceding embodiments wherein selecting, or generating, each dataset comprises:
   selecting, or generating, each dataset from the input data and based on at least one of the previously stored datasets, such that the selected, or generated, dataset does not comprise at least one data value associated with a time value in the dataset that is duplicated in at least one of the previously stored datasets.

14. The computer-implemented method of any one of the preceding embodiments wherein each dataset that meets a first threshold criterion that is caused to be stored in the memory does not comprise a data value that is in a dataset associated with a threshold criterion that does not meet the first threshold criterion.

15. The computer-implemented method of embodiment 14 further comprising:
  receiving a request for data comprising a threshold criterion;
  in response to the request, identifying a dataset associated with a threshold criterion that meets the threshold criterion in the request, and identifying one or more datasets each associated with a threshold criterion that does not meet in the threshold criterion;
  transmitting the identified dataset, or datasets.

16. The computer-implemented method of any one of the preceding embodiments further comprising:
  receiving a request for data comprising a threshold criterion;
  in response to the request, identifying a dataset associated with a threshold criterion that meets the threshold criterion in the request;
  transmitting the identified dataset.

17. The computer-implemented method of embodiment 15 or embodiment 16 wherein the request is received from a requesting device, and the identified dataset is transmitted to the requesting device.

18. The computer-implemented method of any one of the preceding embodiments further comprising:
  processing at least one of the stored datasets in order to remove at least one data value that is not required to meet the threshold criterion associated with the dataset.

19. The computer-implemented method of any one of the preceding embodiments wherein each time value in the input data is associated with a plurality of data values.

20. The computer-implemented method of any one of the preceding embodiments wherein each time value in the stored dataset is associated with a plurality of data values.

21. The computer-implemented method of embodiment 19 or embodiment 20, wherein the plurality of data values for each time value are associated with a corresponding plurality of variables, comprising at least a first variable and a second variable.

22. The computer-implemented method of embodiment 21, wherein the step of selecting, or generating, a dataset or a plurality of datasets that are different to one another from the input data comprises performing a calculation on the plurality of data values for each time value to determine a single data value for each time value, and selecting, or generating, a dataset or a plurality of datasets based on the plurality of determined single values.

23. The computer-implemented method of embodiment 21, wherein the step of obtaining a plurality of threshold criteria comprises obtaining a plurality of threshold criteria for each of the plurality of variables, preferably including obtaining a first plurality of threshold criteria for the data values associated with the first variable and obtaining a second plurality of threshold criteria for the data values associated with the second threshold criteria.

24. The computer implemented method of embodiment 23, wherein the step of selecting, or generating, a dataset or a plurality of datasets comprises selecting, or generating, a dataset or a plurality of datasets in respect of each of the plurality of variables, preferably including selecting, or generating, a first dataset or a first plurality of datasets in respect of the first data values associated with the first variable and selecting, or generating, a second dataset or a second plurality of datasets in respect of the data values associated with the second variable.

25. The computer-implemented method of embodiment 24, wherein the step of determining whether each selected, or generated dataset meets a threshold criterion of the plurality of threshold criteria comprises determining whether each selected, or generated dataset of each of the plurality of variables meets a threshold criterion of the respective plurality of threshold criteria, preferably including determining whether each selected, or generated dataset of the first variable meets a threshold criterion of the first plurality of threshold criteria and determining whether each selected, or generated dataset of the second variable meets a threshold criterion of the second plurality of threshold criteria.

26. The computer-implemented method of any of embodiments 23 to 25, wherein either the first plurality of threshold criteria are the same as the second plurality of threshold criteria, or wherein the first plurality of threshold criteria are different from the second plurality of threshold criteria.

27. The computer-implemented method of any one of embodiments 21 to 26, wherein determining whether a selected, or generated, dataset meets a threshold criterion comprises:
  calculating a first average of the data values associated with the first variable in the dataset;
  calculating a second average of the data values associated with the second variable in the dataset;
  calculating a third average of the data values associated with the first variable in the input data;
  calculating a fourth average of the data values associated with the second variable in the input data;
  calculating a first accuracy score by determining a difference between the first average and the third average and dividing the difference by the third average;
  calculating a second accuracy score by determining a difference between the second average and the fourth average and dividing the difference by the fourth average;
  determining whether the either or both of the first and second accuracy scores meets the threshold criterion.

28. The computer implemented method of embodiment 27, wherein the step of determining whether the either or both of the first and second accuracy scores meets the threshold criterion comprises determining whether the first accuracy score meets the first threshold criterion and/or determining whether the second accuracy score meets the second threshold criterion.

29. The computer-implemented method of any one of the preceding embodiments wherein the plurality of threshold criteria are adjustable.

30. The computer-implemented method of any one of the preceding embodiments wherein the plurality of threshold criteria are adjustable by a user.

31. The computer-implemented method of any one of the preceding embodiments wherein a position of each data value of the stored dataset in a list indicates the time value associated with the data value.

32. The computer-implemented method of any one of the preceding embodiments wherein the stored dataset comprises each data value stored in association with the corresponding time value.

33. The computer-implemented method of any one of the preceding embodiments wherein the plurality of stored datasets are stored in the memory in an array where each data value is stored in association with an identifier indicative of a threshold criterion.

34. The computer-implemented method of any one of the preceding embodiments further comprising:
  analysing the stored datasets and the input data to identify data values and the associated time values that are not stored in the stored datasets;

generating a dataset to include the identified data values, and storing the generated dataset.

35. The computer-implemented method of any one of the preceding embodiments wherein each selected, or generated, dataset that meets a threshold criterion requires less space in the memory in order to be stored in comparison to the input data.

36. The computer-implemented method of any one of the preceding embodiments further comprising:
storing a selected, or generated, dataset that meets a threshold criterion of the plurality of threshold criteria in memory at a local device.

37. The computer-implemented method of any one of the preceding embodiments further comprising:
transmitting a selected, or generated, dataset that meets a threshold criterion of the plurality of threshold criteria to an external device for storage.

38. The computer-implemented method of any one of the preceding embodiments further comprising:
storing each selected, or generated, dataset that meets a first subset of the plurality of threshold criteria in memory at a local device; and
transmitting each selected, or generated, dataset that meets a second subset of the plurality of threshold criteria to an external device for storage.

39. The computer-implemented method of embodiment 38 further comprising:
preventing data of the input data that is not comprised within the datasets stored at the local device and the external device from being stored.

40. The computer-implemented method of any one of the preceding embodiments further comprising:
transmitting a selected, or generated, dataset that meets a first threshold criterion of the plurality of threshold criteria to an external device for storage;
detecting an event based on the input data;
transmitting a selected, or generated, dataset that meets a second threshold criterion of the plurality of threshold criteria that is different to the first threshold criterion to an external device for storage.

41. A computer program product comprising instructions which, when the program is executed by a computer, cause the computer to carry out the method of any one of the preceding embodiments.

42. A computer-readable medium comprising instructions which, when executed by a computer, cause the computer to carry out the method of any one of embodiments 1 to 40.

43. A data processing system comprising one or more processors configured to carry out the method of any one of embodiments 1 to 40.

44. A data processing system comprising:
an input module arranged to:
obtain input data comprising a plurality of data values, wherein each data value is associated with a time value; and
obtain a plurality of threshold criteria;
a processor module arranged to:
(a) select, or generate, a dataset or a plurality of datasets that are different to one another from the input data, and determine whether each selected, or generated dataset meets a threshold criterion of the plurality of threshold criteria;
(b) cause each selected, or generated, dataset that meets the threshold criterion to be stored in memory in association with the threshold criterion; and
repeat (a) and (b) for each threshold criterion of the plurality of threshold criteria, thus causing a plurality of datasets to be stored in the memory, wherein each stored dataset meets a threshold criterion of the plurality of threshold criteria; and
wherein each stored dataset comprises a plurality of data values and an indication of the time value associated with each one of the plurality of data values.

The invention claimed is:

1. A computer-implemented method comprising:
obtaining input data comprising a plurality of data values, wherein each data value is associated with a time value;
obtaining a plurality of threshold criteria; and
(a) selecting a dataset which is a subset of the input data and comprises not all of the plurality of data values from the input data, wherein selecting the dataset comprises iteratively:
(i) selecting a subset of data values from the input data for the selected dataset,
(ii) generating a union dataset comprising the subset of data values in the selected dataset and data values in previously stored datasets, and
(iii) determining whether the union dataset meets a threshold criterion of the plurality of threshold criteria, until said union dataset meets said threshold criterion, wherein the threshold criterion is a statistical measurement based on a comparison between the union dataset and the input data and is expressed numerically, the threshold criterion being
a desired level of accuracy with which the union dataset represents the input data and the desired level of accuracy is a numerical difference between the subset of data and the input data; and
(b) causing the selected dataset to be stored in memory in association with the threshold criterion,
repeating (a) and (b) for each threshold criterion of the plurality of threshold criteria, thus causing a plurality of datasets to be stored in the memory, wherein a union of each stored dataset with the previously stored datasets meets a threshold criterion of the plurality of threshold criteria and wherein all of the data values taken from all of the stored datasets are the same as all of the data values from the input data, such that the stored datasets can be combined to form the input data; and
in response to a request including at least one indicator of a threshold criterion, returning a union of the stored datasets meeting said threshold criterion, and wherein the returned union is guaranteed to represent the input data to at least a minimum statistical measure of accuracy.

2. The computer-implemented method of claim 1, wherein each threshold criterion expressed numerically is expressed as a percentage.

3. The computer-implemented method of claim 1, wherein determining whether the union dataset meets a threshold criterion comprises:
calculating a first average of the data values in the union dataset;
calculating a second average of the data values in the input data;
calculating an accuracy score by determining a difference between the first average and the second average and dividing the difference by the second average; and
determining whether the accuracy score meets the threshold criterion.

4. The computer-implemented method of claim 1, wherein selecting a dataset comprises selecting a dataset that differs from at least one previously selected dataset by greater than, or less than, a threshold amount.

5. The computer-implemented method of claim 1, wherein causing the selected dataset to be stored comprises:
identifying at least one data value associated with a time value in the dataset to be stored that is duplicated in another dataset that is stored in the memory; and
preventing the identified data value from being stored in the memory.

6. The computer-implemented method of claim 1, wherein selecting each dataset comprises:
selecting each dataset from the input data and based on at least one of the previously stored datasets, such that the selected dataset does not comprise at least one data value associated with a time value in the dataset that is duplicated in at least one of the previously stored datasets.

7. The computer-implemented method of claim 1, wherein each dataset that meets a first threshold criterion that is caused to be stored in the memory does not comprise a data value that is in a dataset associated with a threshold criterion that does not meet the first threshold criterion.

8. The computer-implemented method of claim 7, wherein the returning a union of the datasets further comprises:
identifying a dataset associated with a threshold criterion that meets the threshold criterion in the request, and identifying one or more datasets each associated with a threshold criterion that does not meet in the threshold criterion; and
transmitting the identified dataset, or datasets, to a requesting device.

9. The computer-implemented method of claim 1, further comprising:
for at least one of the stored datasets, removing at least one data value that is not required to meet the threshold criterion associated with the dataset.

10. The computer-implemented method of claim 1, wherein each time value in the input data is associated with a plurality of data values and wherein each time value in the stored dataset is associated with a plurality of data values.

11. The computer-implemented method of claim 10, wherein the plurality of data values for each time value are associated with a corresponding plurality of variables, comprising at least a first variable and a second variable.

12. The computer-implemented method of claim 11, wherein the selecting a dataset comprises performing a calculation on the plurality of data values for each time value to determine a single data value for each time value, and selecting a dataset or a plurality of datasets based on the plurality of determined single values.

13. The computer-implemented method of claim 11, wherein the obtaining a plurality of threshold criteria comprises obtaining a plurality of threshold criteria for each of the plurality of variables, including obtaining a first plurality of threshold criteria for the data values associated with the first variable and obtaining a second plurality of threshold criteria for the data values associated with the second threshold criteria.

14. The computer implemented method of claim 13, wherein the selecting a dataset comprises selecting a dataset or a plurality of datasets in respect of each of the plurality of variables, including selecting a first dataset or a first plurality of datasets in respect of the first data values associated with the first variable and selecting a second dataset or a second plurality of datasets in respect of the data values associated with the second variable.

15. The computer-implemented method of claim 14, wherein the determining whether the union dataset meets a threshold criterion of the plurality of threshold criteria comprises:
determining whether each selected dataset of each of the plurality of variables meets a threshold criterion of the respective plurality of threshold criteria, including determining whether each selected dataset of the first variable meets a threshold criterion of the first plurality of threshold criteria and determining whether each selected dataset of the second variable meets a threshold criterion of the second plurality of threshold criteria.

16. The computer-implemented method of claim 13, wherein either the first plurality of threshold criteria are the same as the second plurality of threshold criteria, or wherein the first plurality of threshold criteria are different from the second plurality of threshold criteria.

17. The computer-implemented method of claim 11, wherein determining whether the union dataset meets a threshold criterion comprises:
calculating a first average of the data values associated with the first variable in the union dataset;
calculating a second average of the data values associated with the second variable in the union dataset;
calculating a third average of the data values associated with the first variable in the input data;
calculating a fourth average of the data values associated with the second variable in the input data;
calculating a first accuracy score by determining a difference between the first average and the third average and dividing the difference by the third average;
calculating a second accuracy score by determining a difference between the second average and the fourth average and dividing the difference by the fourth average; and
determining whether either or both of the first and second accuracy scores meets the threshold criterion.

18. The computer-implemented method of claim 17, wherein the determining whether either or both of the first and second accuracy scores meets the threshold criterion comprises determining whether the first accuracy score meets a first threshold criterion and/or determining whether the second accuracy score meets a second threshold criterion.

19. The computer-implemented method of claim 1, wherein the plurality of threshold criteria are adjustable by a user.

20. The computer-implemented method of claim 1, wherein a position of each data value of the stored dataset in a list indicates the time value associated with the data value.

21. The computer-implemented method of claim 1, wherein the stored dataset comprises each data value stored in association with a corresponding time value.

22. The computer-implemented method of claim 1, wherein the plurality of stored datasets are stored in the memory in an array where each data value is stored in association with an identifier indicative of a threshold criterion.

23. The computer-implemented method of claim 1, further comprising:
analysing the stored datasets and the input data to identify data values and the associated time values that are not stored in the stored datasets; and
selecting a dataset to include the identified data values, and storing the selected dataset.

24. The computer-implemented method of claim 1, wherein each selected dataset requires less space in the memory in order to be stored in comparison to the input data.

25. The computer-implemented method of claim 1, further comprising:
storing each selected dataset in memory at a local device.

26. The computer-implemented method of claim 1, further comprising:
transmitting each selected dataset to an external device for storage.

27. The computer-implemented method of claim 1, further comprising:
storing each selected dataset in memory at a local device; and
transmitting each selected dataset to an external device for storage.

28. The computer-implemented method of claim 27, further comprising:
preventing data of the input data that is not comprised within the selected datasets stored at the local device and the external device from being stored.

29. The computer-implemented method of claim 1, further comprising:
transmitting each selected dataset to an external device for storage;
detecting an event based on the input data; and
transmitting a selected dataset that meets a second threshold criterion of the plurality of threshold criteria that is different to the first threshold criterion to an external device for storage.

30. A non-transitory computer-readable medium comprising instructions which, when executed by a computer, cause the computer to carry out a method comprising:
obtaining input data comprising a plurality of data values, wherein each data value is associated with a time value;
obtaining a plurality of threshold criteria; and
(a) selecting a dataset which is a subset of the input data and comprises not all of the plurality of data values from the input data, wherein selecting the dataset comprises iteratively:
(i) selecting a subset of data values from the input data for the selected dataset,
(ii) generating a union dataset comprising the subset of data values in the selected dataset and data values in previously stored datasets, and
(iii) determining whether the union dataset meets a threshold criterion of the plurality of threshold criteria, until said union meets said threshold criterion, wherein the threshold criterion is a statistical measurement based on a comparison between the union dataset and the input data and is expressed numerically, the threshold criterion being
a desired level of accuracy with which the union dataset represents the input data and the desired level of accuracy is a numerical difference between the subset of data and the input data; and
(b) causing the selected dataset to be stored in memory in association with the threshold criterion,
repeating (a) and (b) for each threshold criterion of the plurality of threshold criteria, thus causing a plurality of datasets to be stored in the memory, wherein a union of each stored dataset with the previously stored datasets meets a threshold criterion of the plurality of threshold criteria and wherein all of the data values taken from all of the stored datasets are the same as all of the data values from the input data, such that the stored datasets can be combined to form the input data; and
in response to a request including at least one indicator of a threshold criterion, returning a union of the stored datasets meeting said threshold criterion, and where in the returned union is guaranteed to represent the input data to at least a minimum statistical measure of accuracy.

31. A data processing system comprising:
a memory, and a processor coupled to the memory, the processor in conjunction with the memory configured to provide an input module and a processor module;
the input module arranged to:
obtain input data comprising a plurality of data values, wherein each data value is associated with a time value; and
obtain a plurality of threshold criteria;
the processor module configured to:
(a) select a dataset which is a subset of the input data and comprises not all of the plurality of data values from the input data, wherein selecting the dataset comprises iteratively:
(i) select a subset of data values from the input data for the selected dataset,
(ii) generating a union dataset comprising the subset of data values in the selected dataset and data values in previously stored datasets, and
(iii) determine whether the union dataset meets a threshold criterion of the plurality of threshold criteria, until said union dataset meets said threshold criterion, wherein the threshold criterion is a statistical measurement based on a comparison between the union dataset and the input data and is expressed numerically, the threshold criterion being
a desired level of accuracy with which the union dataset represents the input data and the desired level of accuracy is a numerical difference between the subset of data and the input data;
(b) cause the selected dataset to be stored in memory in association with the threshold criterion; and
repeat (a) and (b) for each threshold criterion of the plurality of threshold criteria, thus causing a plurality of datasets to be stored in the memory, wherein a union of each stored dataset with the previously stored datasets meets a threshold criterion of the plurality of threshold criteria and wherein all of the data values taken from all of the stored datasets are the same as all of the data values from the input data, such that the stored datasets can be combined to form the input data; and
in response to a request including at least one indicator of a threshold criterion, returning a union of the stored datasets meeting said threshold criterion, and where in the returned union is guaranteed to represent the input data to at least a minimum statistical measure of accuracy.

* * * * *